United States Patent [19]
Hirao et al.

[11] Patent Number: 6,123,774
[45] Date of Patent: Sep. 26, 2000

[54] APPARATUS AND METHOD OF MANUFACTURING SEMICONDUCTOR ELEMENT

[75] Inventors: Takashi Hirao, Moriguchi; Akihisa Yoshida, Kyoto; Masatoshi Kitagawa, Hirakata, all of Japan

[73] Assignee: Matsushita Electric Industrial Co., Ltd., Japan

[21] Appl. No.: 08/867,487

[22] Filed: Jun. 2, 1997

Related U.S. Application Data

[63] Continuation of application No. 08/482,405, Jun. 7, 1995, abandoned.

[30] Foreign Application Priority Data

Jun. 10, 1994 [JP] Japan ................................. 6-128941

[51] Int. Cl.$^7$ .................................................. H01J 37/00
[52] U.S. Cl. ............................................ 118/723; 156/345
[58] Field of Search ............................ 156/345; 118/719, 118/724, 723 FE; 204/298.26, 298.35, 298.25; 315/111.81; 250/423 R, 492.21

[56] References Cited

U.S. PATENT DOCUMENTS 4,713,585  12/1987  Ohno et al. ........................ 315/111.81

*Primary Examiner*—Thi Dang
*Attorney, Agent, or Firm*—Morrison & Foerster LLP

[57] ABSTRACT

A large area semiconductor element can be manufactured with high productivity, which has low electric resistance at the boundary face of a metal and a semiconductor and has excellent characteristics and reliability. A manufacturing apparatus comprises an ion irradiation means for simultaneously irradiating hydrogen ions and ions containing an element serving as a dopant of a semiconductor to a semiconductor film or a substrate in an atmosphere under reduced pressure, and a film forming means which forms a thin film or a heat treatment means which conducts a heat treatment without exposing a sample to an air. When a sample having an a-Si:H thin film is brought into a sample preparation chamber by opening a gate valve, the chamber is exhausted to have the inside pressure of $10^2$ to $10^{-3}$ Pa. Then, the sample is forwarded to an ion irradiation chamber from the sample preparation chamber via an intermediate chamber of which the pressure is maintained in the range of $10^{-3}$ to $10^{-7}$ Pa, and ions such as phosphous are irradiated. After the ion irradiation, a gate valve is opened to transfer the sample to the intermediate chamber, and then a gate valve is opened to forward the sample to a deposition chamber. Subsequently, Ar gas is let in to the deposition chamber and a metal film of Al/Ti is deposited by a sputtering method. After the deposition, the sample is forwarded to a sample carry-out chamber via the intermediate chamber.

8 Claims, 5 Drawing Sheets

APPARATUS AND METHOD OF MANUFACTURING SEMICONDUCTOR ELEMENT

This application is a continuation of application Ser. No. 08/482,405, filed Jun. 7, 1995, now abandoned.

FIELD OF THE INVENTION

This invention relates to a manufacturing apparatus and a manufacturing method used for manufacturing a semiconductor element or performing a surface treatment in the field of the semiconductor industry. In particular, this invention relates to a method of and an apparatus for injecting impurities and manufacturing an element with high reliability applied in the process of manufacturing a large area semiconductor element such as a film transistor, which is used, for example, in an active matrix system liquid crystal display, or a solar battery.

BACKGROUND OF THE INVENTION

A conventional process of manufacturing a large area semiconductor element applies the technique of injecting impurities into a semiconductor thin film etc. An example of this method comprises the steps of:

(1) discharge-decomposing a gas containing impurities for controlling valence electrons such as hydrogen diluted with phosphine ($PH_3$);

(2) driving produced ions without mass-separating them as a wide aperture ion beam into a semiconductor thin film to form a doping layer;

(3) subsequently removing the element into the air and forming a metal film in a separate vacuum device; and (4) patterning, rinsing, and heat treating the metal film, which is then completed as a semiconductor element.

In the above-mentioned conventional method, it is easy to dope a large area.

However, when a doping process takes place, hydrogen ions are injected simultaneously, so due to highly concentrated hydrogen atoms which are present near the surface of the doping layer, the doping layer becomes extremely unstable and active near its surface. In addition, since other processes after the ion irradiation are performed in other devices, samples are exposed to air, which results in forming an oxide film by easily bonding with moisture or oxygen in the air, as shown in FIG. 4 (a). As a result, the characteristics and reliability of the semiconductor element are deteriorated.

SUMMARY OF THE INVENTION

It is an object of this invention to solve the above-mentioned problems in conventional systems by providing a semiconductor element having excellent characteristics and reliability, which is accomplished without exposing an extremely unstable and active surface area of a doping layer to a gas which is formed by injecting hydrogen ions and ions containing an element serving as a dopant in a semiconductor simultaneously, and without forming an oxide layer on the surface of a doping layer by forming an electrode or performing a heat treatment.

In order to accomplish these and other objects and advantages, an apparatus of manufacturing apparatus of a semiconductor element in this invention comprises an ion irradiation means for simultaneously irradiating hydrogen ions and ions containing an element serving as a dopant of a semiconductor to a semiconductor film or a substrate in an atmosphere under reduced pressure, and at least one means performed successively after the ion irradiation to the surface of the semiconductor film or the substrate without exposing the means to an air, which is selected from the group comprising a film forming means which forms a thin film and a heat treatment means which conducts a heat treatment.

Next, a method of manufacturing a semiconductor element of this invention comprises the steps of:

(1) simultaneously irradiating hydrogen ions and ions containing an element serving as a dopant of a semiconductor to a semiconductor film or a substrate in an atmosphere under reduced pressure; and (2) performing one means successively after the ion irradiation to the surface of the semiconductor film or the substrate without exposing the means to air, the means being selected from the group comprising a step of forming a thin film and a step of conducting a heat treatment.

It is preferable in the above-mentioned manufacturing apparatus and manufacturing method of this invention that the step of ion irradiation and the step of film formation or the step of heat treatment are connected via a partition valve or a gate valve. In this way, all the steps remain in a sealed condition.

Furthermore, it is preferable in the above-mentioned manufacturing apparatus and manufacturing method of this invention that the thin film formed on the surface of a semiconductor film or a substrate comprises a metal. As a result, an oxide layer is not present at a boundary face of the metal/the doping layer, thereby attaining a semiconductor element having excellent characteristics and reliability.

In addition, it is preferable in the above-mentioned manufacturing apparatus and manufacturing method of this invention that the heat treatment is conducted with a lamp. This is because the use of a lamp is advantageous for attaining high heating efficiency.

Also, it is preferable in the above-mentioned manufacturing apparatus and manufacturing method of this invention that the ion irradiation means is performed in an atmosphere under reduced pressure of from 1 to $10^{-3}$ Pa. This range enables efficient ion irradiation.

It is preferable in the above-mentioned manufacturing apparatus and manufacturing method of this invention that the dopant element is at least one element selected from the group comprising phosphorus (P), boron (B), arsenic (As), silicon (Si), and nitrogen (N). Accordingly, the dopant element can function excellently.

Furthermore, it is suitable in the above-mentioned manufacturing apparatus and manufacturing method of this invention that the semiconductor film comprises a hydrogenated amorphous silicon (a-Si:H). Although any substance can be used for the semiconductor film, a-Si:H particularly has an extremely unstable condition near the surface of the doping layer.

In addition, it is preferable in the above-mentioned manufacturing apparatus and manufacturing method of this invention that the heat treatment is conducted in a gas atmosphere containing hydrogen atoms.

Also, it is preferable in the above-mentioned manufacturing apparatus and manufacturing method of this invention that the heat treatment is conducted at a temperature of from 100 to 1000° C.

According to the configuration of the apparatus for manufacturing a semiconductor element of this invention, since the apparatus comprises an ion irradiation means for simultaneously irradiating hydrogen ions and ions containing an element serving as a dopant of a semiconductor to a semiconductor film or a substrate in an atmosphere under reduced pressure, and at least one means performed successively after the ion irradiation to the surface of the semiconductor film or the substrate without exposing the means to an air, which is selected from the group comprising a film forming means which forms a thin film and a heat treatment means which conducts a heat treatment, it is no longer necessary to expose an extremely unstable and active surface area of a doping layer to a gas which is formed by injecting hydrogen ions and ions containing an element serving as a dopant for a semiconductor simultaneously. Also, an oxide layer can be prevented from being formed on the surface of a doping layer by forming an electrode or performing a heat treatment, so that a semiconductor element having excellent characteristics and reliability can be attained.

Next, since the method of manufacturing a semiconductor element of this invention comprises the steps of:

(1) simultaneously irradiating hydrogen ions and ions containing an element serving as a dopant of a semiconductor to a semiconductor film or a substrate in an atmosphere under reduced pressure; and (2) performing one means successively after the ion irradiation to the surface of the semiconductor film or the substrate without exposing the means to a gas, the means being selected from the group consisting of a step of forming a thin film and a step of conducting a heat treatment means; it is no longer necessary to expose an extremely unstable and active surface area of a doping layer to an atmosphere which is formed by injecting hydrogen ions and ions containing an element serving as a dopant of a semiconductor simultaneously. Also, an oxide layer can be prevented from being formed on the surface of a doping layer by forming an electrode or performing a heat treatment, so that a semiconductor element having excellent characteristics and reliability can be attained.

Furthermore, this invention enables manufacturing of a large area semiconductor element with high reliability, such as a film transistor array used in an image scanner or in an active matrix system liquid crystal display or a solar battery.

BRIEF DESCRIPTION OF THE DRAWINGS

FIG. 4 (*b*) is an element distribution graph in a depth direction using a sample of semiconductor element manufactured by a manufacturing apparatus in a first embodiment of this invention.

DETAILED DESCRIPTION OF THE INVENTION

This invention will be explained in detail with reference to the attached figures and the following examples. The examples are illustrative and should not be construed as limiting the invention in any way.

EXAMPLE 1

Figure 1:
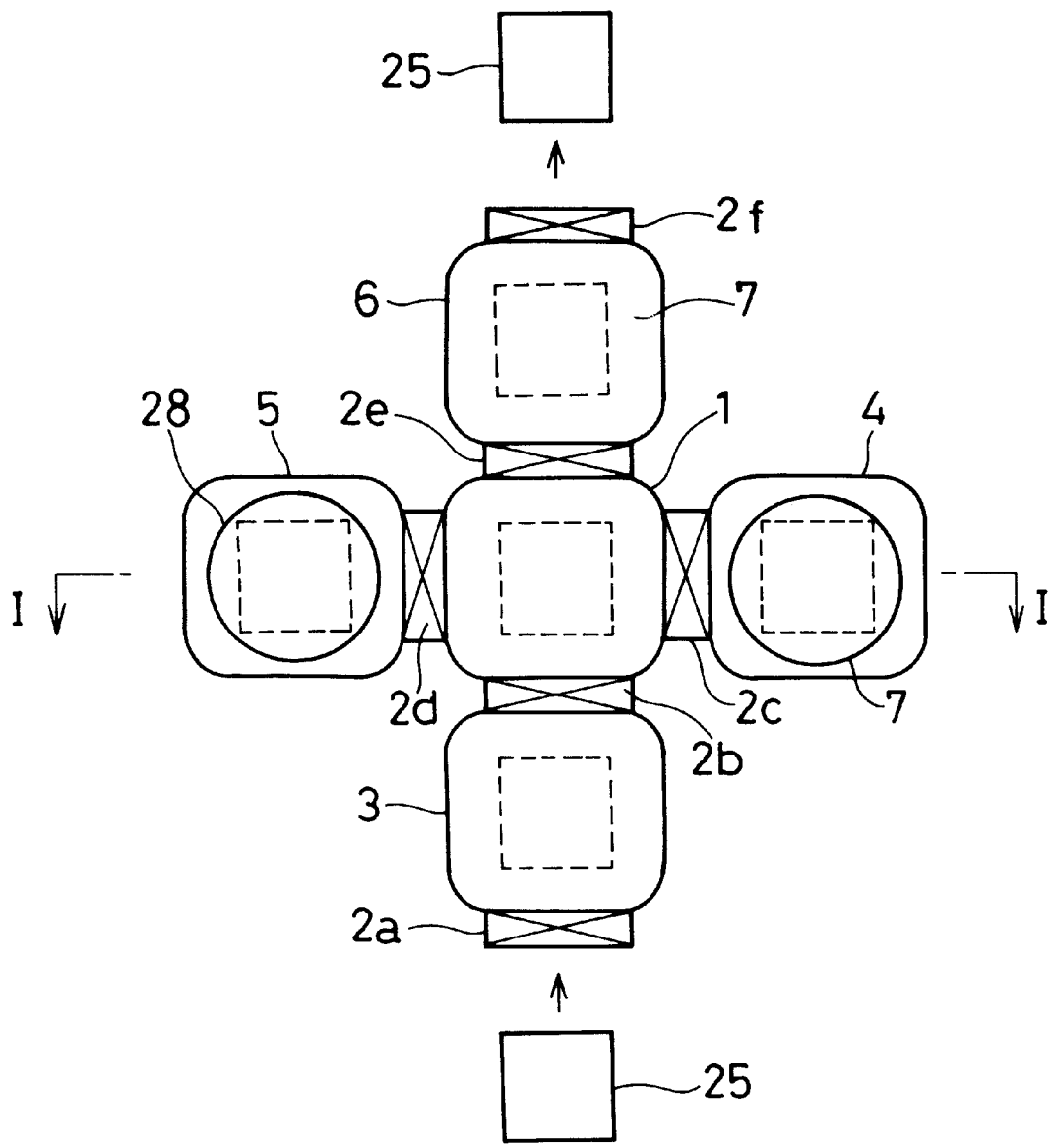
FIG. 1 is a schematic view showing the structure of a manufacturing apparatus in a first embodiment of this invention.
Figure 2:
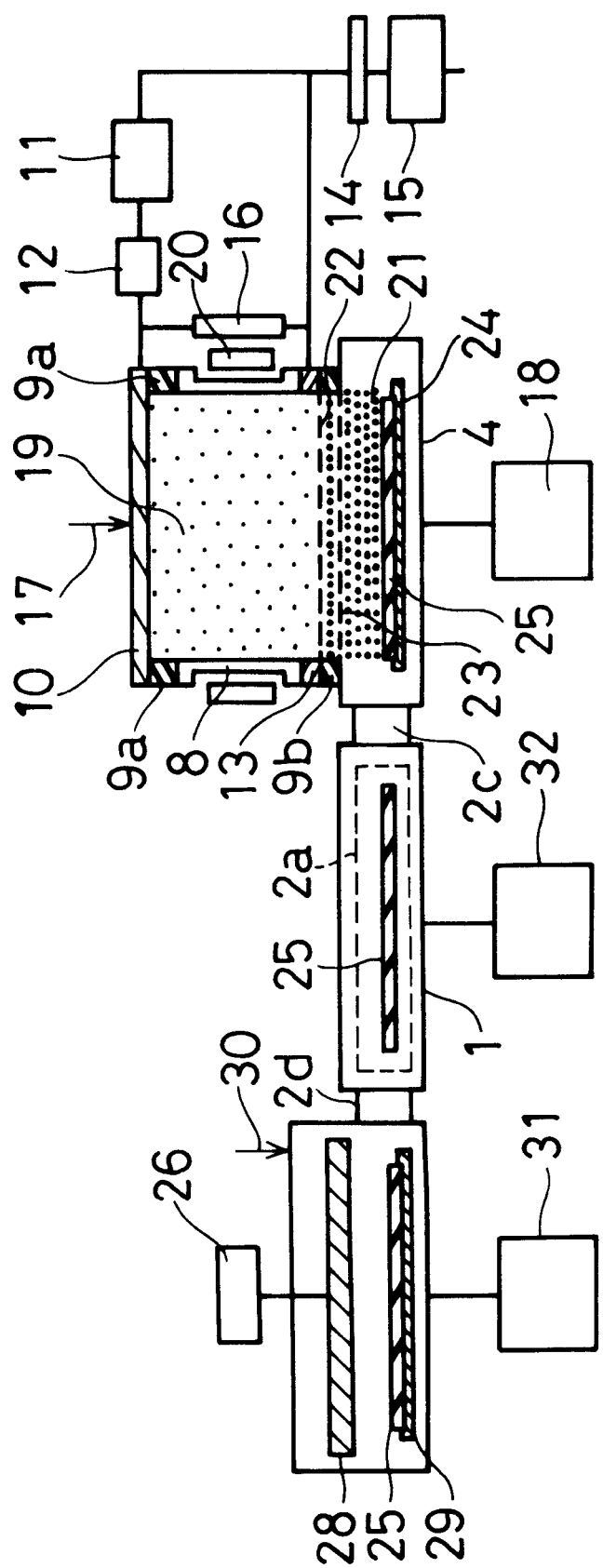
FIG. 2 is a structural cross-sectional view taken on line I—I of a first embodiment (FIG. 1) in this invention.

FIG. 1 is a schematic view showing the structure of an apparatus for manufacturing a semiconductor element in a first embodiment of this invention, and FIG. 2 is a structural cross-sectional view taken on line I—I of FIG. 1.

An intermediate chamber 1 is simultaneously connected to a sample preparation chamber 3 via a gate valve 2*b*, to an ion irradiation chamber 4 via a gate valve 2*c*, to a deposition chamber 5 via a gate valve 2*d*, and to a sample carry-out chamber 6 via a gate valve 2*e*. The ion irradiation chamber 4 is provided with an ion source 7 (FIG. 2), and this ion source 7 is formed as follows. An electrode 10 is disposed on a conductive container 8 of the ion source 7 (FIG. 2) sandwiching an insulating substrate 9*a*. The electrode 10 is connected to a high-frequency electric source 11 via a matching box 12. An electrode 13 which is combined with the conductive container 8 is connected to a DC electric source 15 via a coil 14.

Furthermore, a ground section of the high-frequency electric source 11 is connected through direct current to the electrode 13, and a potential on the ground side of the high-frequency electric source 11 is made to become equal to a potential on the high potential side of the DC electric source 15. In addition, by connecting a supply section of the high-frequency electric power and an output section of the DC electric source 15 through a coil 16, the electrode 10 and the electrode 13 are shorted through the DC electric source to attain a balance in a distribution of the DC electric field inside the ion source 7.

High-frequencies to be applied here are 13.56 MHz, 27.12 MHz, and so on. Electric power energy arising plasma is preferably in the range of 100 to 500 w and DC voltage (acceleration voltage) is set to be in the range of 3 to 30 kV, when a semiconductor comprises an a-Si:H (hydrogenated amorphous silicon). It is more preferable to set the range from 8 to 15 kV. When the electric power energy is under 3 kV, ions can not be injected and the semiconductor is etched. Similarly, it is not suitable to set the electric power energy to exceed 30 kV, since ions are injected deeply.

The step of ion irradiation is conducted by letting in a gas containing hydrogen and a dopant element from a gas inlet tube 17. Phosphorus (P), boron (B), arsenic (As), silicon (Si), and nitrogen (N) can be used, for example, as the dopant element. Atmosphere conditions for the ion irradiation comprise maintaining the pressure by a vaccum pump 18 in the range of, for example, 1 to $10^{-2}$ Pa. Under this pressure, high-frequency (13.56 MHz) electric power is generated between the electrode 10 and the conductive container 8, and this high-frequency electric power produces a uniform plasma 19 inside the conductive container 8. In this case, a permanent magnet or an electromagnet may be placed outside the conductive container 8 to generate a magnetic field inside the conductive container 8 and to increase ion electric current by highly exciting the plasma to be produced. This embodiment uses a permanent magnet 20.

Ions 21 inside the plasma 19 which were produced in the above-described manner are pushed out from a perforated panel 22 disposed at an opening section of the electrode 13 to the outside of the ion source. Then, the ions 21 are accelerated until arriving at a perforated panel 23 of a ground potential and irradiated to a sample 25 placed on a substrate stand 24. In this embodiment, the ion source is placed in an upper position to conduct the ion irradiation.

However, the ion irradiation may be performed by laying down the ion source and letting the sample stand vertically.

On the other hand, inside the deposition chamber 5, a target electrode 28 connected via a matching box 26 to a high-frequency electric source is disposed opposite to a substrate stand 29. For the deposition of a metal etc., a gas such as argon (Ar) is fed into the deposition chamber 3 through a gas inlet tube 30, and the pressure is maintained by a vacuum pump 31 in the range of 1 to $10^{-3}$ Pa. In optimum condition, the pressure is controlled in the range of $10^{-1}$ to $10^{-2}$ Pa, and plasma is produced by high-frequency electric power applied to the target electrode 28. Then, by sputtering the target electrode 28, a thin film such as a metal is deposited on the sample 25 placed on the surface of the substrate stand 29. At this time, a magnetic field may be generated near the target electrode 28 with a permanent magnet etc., so that magnetron discharge is produced for enhancing a sputtering efficiency.

Although the target electrode is placed in an upper position in this embodiment, the target electrode may be positioned below and a film may be deposited to samples which are placed on the target electrode with an interval. Alternatively, the target electrode may be laid down and the film deposition may be conducted to samples standing vertically.

Furthermore, this embodiment applies a sputtering method for deposition of a film, but other methods may be applied in accordance to the type of the film, such as resistance heat deposition, electron beam heat deposition, plasma CVD. In addition, a multilayer film may be formed by installing a plurality of deposition chambers. Also, it is necessary to maintain the pressure in the intermediate chamber 1, which is used for forwarding samples, in the range of $10^{-3}$ to $10^{-7}$ Pa by a vaccum pump 32. In the case of plasma CVD, the pressure is maintained in the range of $10^3$ to 1 Pa.

Also in this embodiment, only the step of film deposition is performed after the ion irradiation, but it is also possible to configure the apparatus and the method such that other steps such as etching a protective coating or removing a resist or cleaning the surface are added before the ion irradiation, or the steps of etching a deposited film or depositing other films are added after the ion irradiation.

Figure 3:
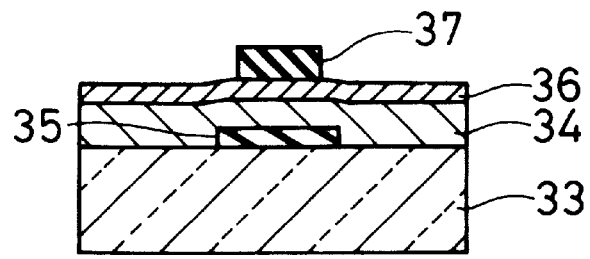
FIGS. 3 (*a*) to 3 (*d*) are schematic views showing the steps of manufacturing a semiconductor element in a first embodiment of this invention.
Figure 3:
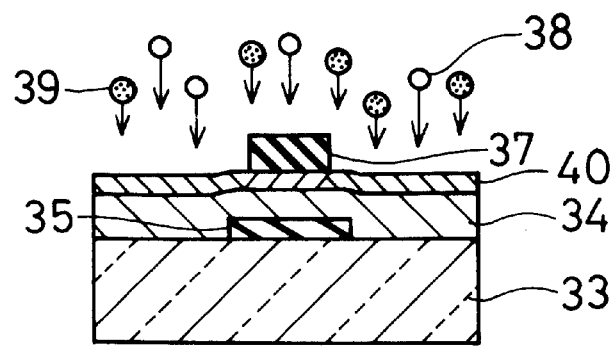
Figure 3:
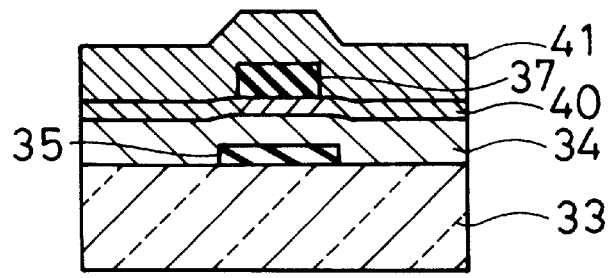
Figure 3:
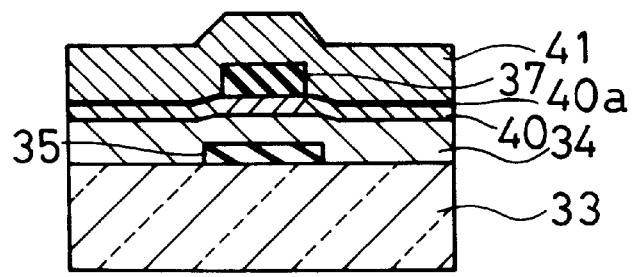

FIGS. 3 (a) to 3 (d) are schematic views showing the steps of manufacturing a semiconductor element in this embodiment. A liquid crystal device was used here as an example of a semiconductor element.

The sample 25 is formed, as shown in FIG. 3 (a), by depositing a gate electrode 34, a gate insulating film 35, an a-Si:H film 36 comprising a semiconductor, and a channel protective coating 37 on the surface of a glass substrate 33 having a thickness of 0.5 to 2 mm. The gate electrode 34 is made of at least one material selected from the group consisting of Cr, Al, Mo, and silicide mixed crystals thereof. A preferable thickness of the gate electrode 34 is from 50 nm to 200 nm. Next, the gate insulating film 35 is formed by using at least one material selected from the group consisting of $SiO_2$, SiN, $Si_3N_4$, SiON, and $Al_2O_3$, and its preferable thickness is from 100 nm to 500 nm. Then, the a-Si:H film 36 is formed by adding hydrogen at 5 to 20 atm % to amorphous silicon, and its preferable thickness is from 10 nm to 300 nm. The protective coating 37 is made of at least one material selected from the group consisting of $SiO_2$, SiN, $Si_3N_4$ SiON, and $Al_2O_3$, and its preferable thickness is from 100 nm to 1 $\mu$m.

Now, this sample 25 is transferred into the sample preparation chamber 3 by opening the gate valve 2a (FIG. 1), and when the gate valve 2a is closed, the sample preparation chamber 3 is exhausted so that the inside pressure becomes from $10^2$ to $10^{-3}$ Pa.

Subsequently, the sample 25 is forwarded from the sample preparation chamber 3 by way of the intermediate chamber 1 of which the pressure is $10^{-3}$ to $10^{-7}$ Pa to the ion irradiation chamber 4, and ions are irradiated. At this time, as shown in FIG. 3 (b), hydrogen ions 38 and ions 39 containing P are simultaneously irradiated by using an ion source gas of hydrogen dilution at 5 vol. % $PH_3$ and with acceleration voltage of 10 kV, and a n-type doping layer 40 is formed.

After the ion irradiation, the ion source gas is stopped from coming in, and the pressure inside the ion irradiation chamber 4 is adjusted to be from $10^{-2}$ to $10^{-4}$ Pa. Then, the gate valve 2c is opened, and the sample 25 is transferred to the intermediate chamber 1 having the pressure maintained at $10^{-3}$ to $10^{-7}$ Pa. After the sample 25 is transferred to the intermediate chamber 1, the gate valve 2c is closed, which is followed by opening the gate valve 2d to forward the sample 25 to the deposition chamber 5. After the transfer to the deposition chamber 5, the gate valve 2d is closed. Subsequently, Ar gas is let in and a metal film 41 of Al/Ti is deposited by a sputtering method as shown in FIG. 3 (c).

After this process, the sample 25 is brought into the sample carry-out chamber 6 via the intermediate chamber 1 and then brought out to open air. In this way, the irradiation of the ions containing hydrogen atoms and the dopant element and the formation of a metal thin film can be performed successively without exposing the sample to air. Here, when a metal film forming a silicon compound is combined with a silicon-type material, as shown in FIG. 3 (d), a silicon compound 40a with low resistance is formed at a boundary face of the doping layer 40 and the metal 41.

Figure 4:
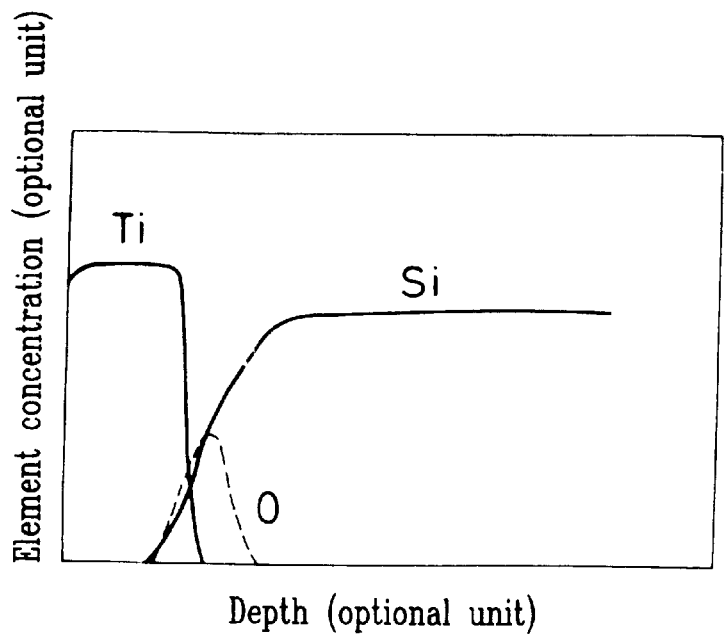
FIG. 4 (*a*) is an element distribution graph in a depth direction using a sample of semiconductor element manufactured by a conventional manufacturing apparatus.
Figure 4:
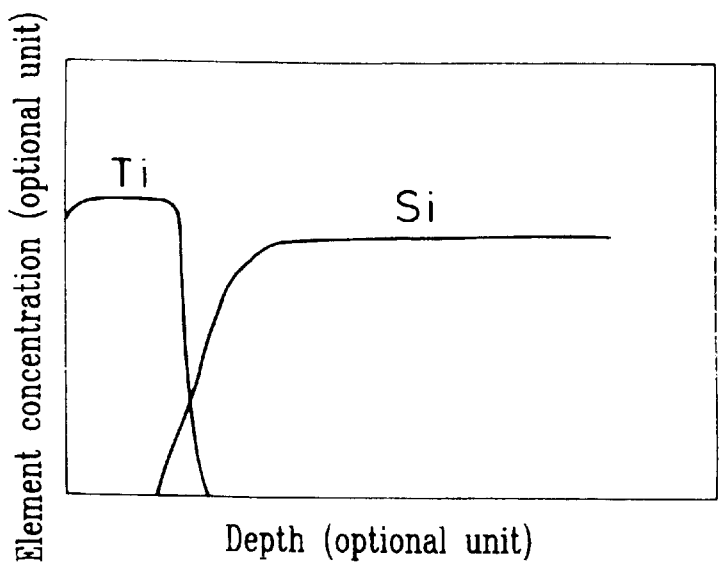

FIGS. 4 (a) and 4 (b) are element distribution graphs in a depth direction using samples of semiconductor elements manufactured by the manufacturing apparatus of this invention and by a conventional manufacturing apparatus.

As clearly shown in FIGS. 4 (a) and 4 (b), the manufacturing apparatus of this embodiment can provide a semiconductor element having excellent characteristics and reliability which does not have an oxide layer formed at the boundary face of a metal/a doping layer.

EXAMPLE 2

Figure 5:
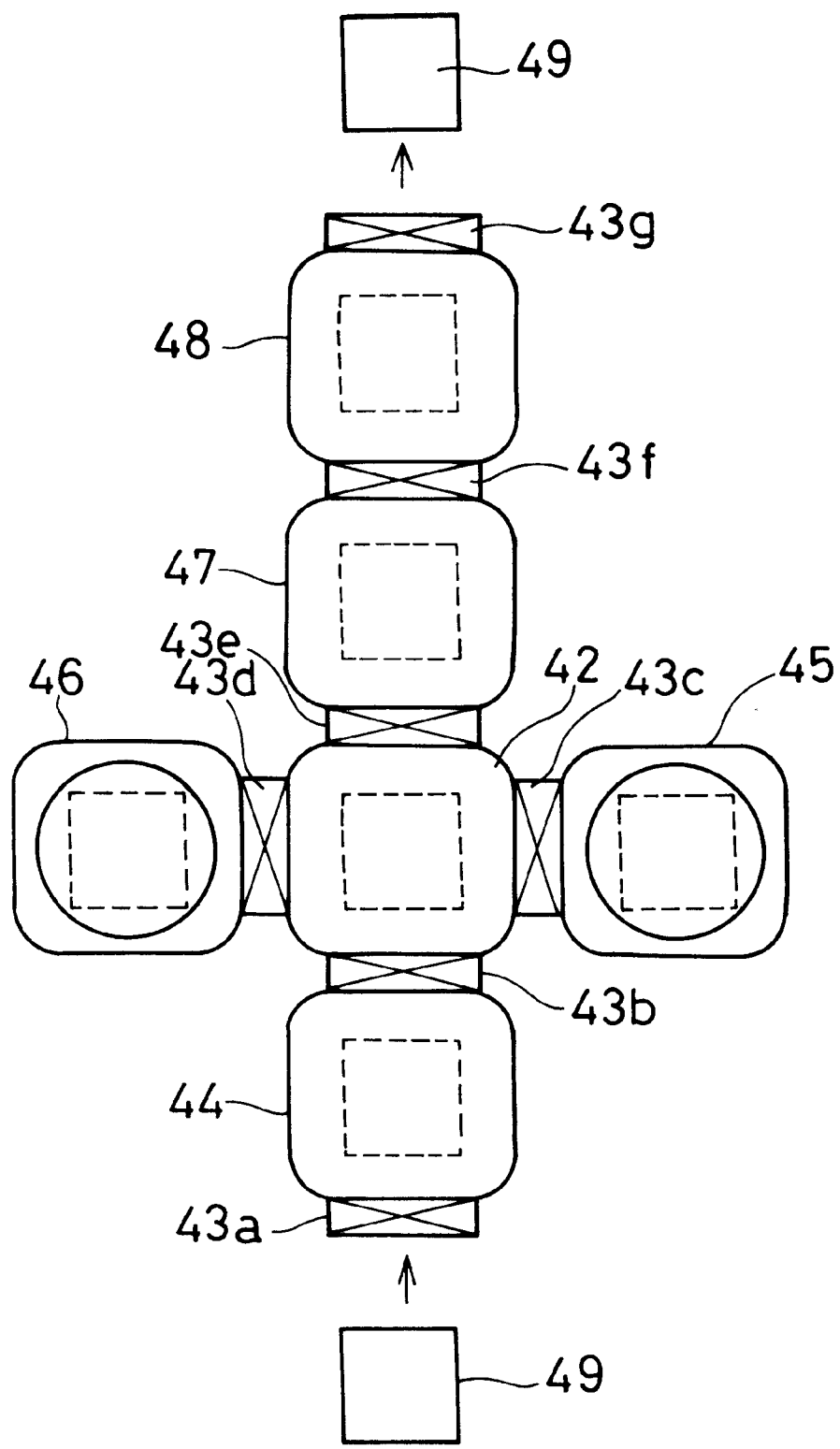
FIG. 5 is a schematic view showing the structure of a manufacturing apparatus in a second embodiment of this invention.

FIG. 5 is a schematic view showing a manufacturing apparatus in a second embodiment.

This manufacturing apparatus comprises a sample preparation chamber 44, an ion irradiation chamber 45, a deposition chamber 46, a heat treatment chamber 47, and a sample carry-out chamber 48 which are connected via an intermediate chamber 42 and valves 43b to 43e. A sample 49 is brought into the sample preparation chamber 44 by opening a gate valve 43a, and when the gate valve 43a is closed, the sample preparation chamber 44 is exhausted so that the inside pressure becomes from $10^2$ to $10^{-3}$ Pa.

Subsequently, the sample 49 is forwarded from the sample preparation chamber 44 by way of the gate valve 43b, the intermediate chamber 42, and the gate valve 43c to the ion irradiation chamber 45, where ions are irradiated. At this time, hydrogen ions and ions containing P are simultaneously irradiated by using an ion source gas of hydrogen dilution at 5 vol. % $PH_3$ and with acceleration voltage of 10 kV, and a n-type doping layer is formed.

After the ion irradiation, the flow of ion source gas is stopped and the pressure inside the ion irradiation chamber 45 is adjusted to be from $10^{-2}$ to $10^{-4}$ Pa. Then, the gate valve 43c is opened, and the sample 49 is transferred to the intermediate chamber 42 having the pressure maintained at $10^{-3}$ to $10^{-7}$ Pa. After the sample 49 is forwarded to the intermediate chamber 42, the gate valve 43c is closed, which is followed by opening the gate valve 43d to transfer the sample 49 to the deposition chamber 46. After the transfer to the deposition chamber 46, the gate valve 43d is closed. Subsequently, Ar gas is let in and a metal film of Al/Ti is deposited by a sputtering method. Thereafter, the sample 49 is brought into the heat treatment chamber 47 by way of the gate valve 43d, the intermediate chamber 42, and the gate valve 43e. Then, heat treatment is conducted in an hydrogen atmosphere.

This embodiment is comprised of an apparatus and a method, in which a metal film is formed after ions containing hydrogen and an dopant element are irradiated, and a heat treatment is conducted thereafter. However, it is also possible to configure the apparatus and the method such that the heat treatment is performed after the ion irradiation, and then the film such as metal is formed without exposing the sample to air.

Here, the heat treatment is performed to activate the doping element and to restore damage caused by the ion injection. When the heat treatment is conducted after the metal film is formed as in this embodiment, it is advantageous for improving contact properties between the metal and the doping layers. An atmosphere of the heat treatment preferably comprises hydrogen, but it is also possible to perform the heat treatment in an atmosphere of inactive gas such as He, Ar, or in an atmosphere of gaseous nitrogen having high purity, or in a vacuum.

The heating temperature is preferably determined to be lower than the melting point of a material comprising a thin film or of the substrate. Furthermore, the preferable temperature for combining the metal film with the silicon-type material is a temperature suitable for forming a metal silicon compound. For example, when an a-Si:H film is used, the temperature should be determined to be from 100 to 350° C. so that hydrogen which is a composite element of a-Si:H does not separate, and particularly the temperature of about 250° C. is more preferable. When a glass substrate is used, the temperature of 500° C. or lower is suitable. Furthermore, when the substrate comprises quartz and the a-Si:H film is recrystalized, the preferable temperature ranges from 500 to 1000° C. However, when a lamp is used in the heat treatment to heat up the vicinity of the sample surface in a short time, the heating temperature of the sample surface is not necessarily limited to the temperature below the melting point of the substrate.

As mentioned above, after the sample 49 was subjected to the heat treatment in the heat treatment chamber 47, the sample 49 is forwarded to the sample carry-out chamber 48 via a gate valve 43f. Then, a gate valve 43g is opened after purging with nitrogen etc., and the sample 49 is brought out in an open air. In this embodiment, for example, when the heat treatment is conducted at the temperature of 500 to 900° C. by using a polycrystalline silicon for the semiconductor film and Ti for the metal thin film in the heat treatment chamber 47, since the temperature of forming $TiSi_2$ is higher than 600° C., a silicon compound $TiSi_2$ layer with low resistance is formed at a boundary face of the metal Ti and the doping layer Si through the heat treatment.

According to the above-mentioned method, as shown in FIGS. 3(a) to (d), the metal thin film 41 and the doping layer 40 can be formed without exposing the step of forming a silicon compound layer 40a with low resistance to air. As a result, the steps of irradiating ions containing hydrogens and an dopant element, forming a metal thin film, and performing a heat treatment can be conducted successively without exposing the sample to air. In this way, the apparatus of this embodiment can also provide a semiconductor element having excellent characteristics and reliability, which does not have an oxide layer formed at the boundary face between the metal and the doping layers.

The invention may be embodied in other forms without departing from the spirit or essential characteristics thereof. The embodiments disclosed in this application are to be considered in all respects as illustrative and not as restrictive. The scope of the invention is indicated by the appended claims rather than by the foregoing description, and all changes which come within the meaning and range of equivalency of the claims are intended to be embraced therein.

What is claimed is:

1. An apparatus for manufacturing a semiconductor element, comprising:

an ion irradiation chamber comprising an ion source, a first perforated panel disposed at an opening section of an electrode, a second perforated panel disposed near the first perforated panel and a substrate stand disposed outside said ion source;

wherein said ion source generates ions comprising hydrogen ions and dopant ions containing an element serving as a dopant;

said first and second perforated panels and said substrate stand are arranged to simultaneously irradiate said hydrogen ions and dopant ions onto a semiconductor film or substrate without separation of said hydrogen ions and dopant ions; and a deposition chamber including a second gas injection tube for forming a thin metal film on the semiconductor film or substrate after the ion irradiation without exposing the semiconductor film or substrate to air.

2. The manufacturing apparatus as claimed in claim 1, wherein the ion irradiation chamber and the deposition chamber are connected via a partition valve or a gate valve.

3. The manufacturing apparatus as claimed in claim 1, wherein the ion source irradiates ions in an atmosphere that is maintained under a reduced pressure of from 1 to $10^{-3}$ Pa.

4. An apparatus for manufacturing a semiconductor element, comprising:

an ion irradiation chamber comprising an ion source, a first perforated panel disposed at an opening section of an electrode, a second perforated panel disposed near the first perforated panel and a substrate stand disposed outside said ion source;

wherein said ion source generates ions comprising hydrogen ions and dopant ions containing an element serving as a dopant;

said first and second perforated panels and said substrate stand are arranged to simultaneously irradiate said hydrogen ions and dopant ions onto a semiconductor film or substrate without separation of said hydrogen ions and dopant ions;

a deposition chamber including a second gas injection tube for forming a thin metal film on the semiconductor film or substrate after the ion irradiation; and means for conducting heat treatment on the semiconductor film or substrate after the ion irradiation without exposing the semiconductor film or substrate to air.

5. The manufacturing apparatus as claimed in claim 4, wherein the ion irradiation chamber, the deposition chamber and the heat treatment means are connected via a partition valve or a gate valve.

6. The manufacturing apparatus as claimed in claim 4, wherein the heat treatment means comprises a lamp.

7. The manufacturing apparatus as claimed in claim 4, wherein the ion source irradiates ions in an atmosphere that is maintained under a reduced pressure of from 1 to $10^{-3}$ Pa.

8. The manufacturing apparatus as claimed in claim 4, wherein the heat treatment means conducts heat treatment in a gas atmosphere containing hydrogen atoms.

* * * * *